United States Patent
Stautner et al.

(10) Patent No.: US 11,035,807 B2
(45) Date of Patent: Jun. 15, 2021

(54) THERMAL INTERPOSER FOR A CRYOGENIC COOLING SYSTEM

(71) Applicant: GENERAL ELECTRIC COMPANY, Schenectady, NY (US)

(72) Inventors: Ernst Wolfgang Stautner, Niskayuna, NY (US); Eric George Budesheim, Wynantskill, NY (US)

(73) Assignee: General Electric Company, Schenectady, NY (US)

(*) Notice: Subject to any disclaimer, the term of this patent is extended or adjusted under 35 U.S.C. 154(b) by 416 days.

(21) Appl. No.: 15/915,015

(22) Filed: Mar. 7, 2018

(65) Prior Publication Data
US 2019/0277784 A1  Sep. 12, 2019

(51) Int. Cl.
*G01N 24/08* (2006.01)
*F25D 19/00* (2006.01)
(Continued)

(52) U.S. Cl.
CPC .......... *G01N 24/08* (2013.01); *F25D 19/006* (2013.01); *F25D 29/001* (2013.01); *F28F 13/00* (2013.01);
(Continued)

(58) Field of Classification Search
CPC .... F17C 3/00; F17C 3/02; F17C 3/302; F17C 3/08; F17C 3/085; F17C 13/006;
(Continued)

(56) References Cited

U.S. PATENT DOCUMENTS 3,260,055 A * 7/1966 Webb ................... F17C 13/026
62/6
3,430,455 A * 3/1969 Hogan ................... F17C 13/00
62/383

(Continued)

FOREIGN PATENT DOCUMENTS

CA  2572842 A1 * 1/2006 ............... F25D 3/10
EP  0304860 A2 * 3/1989 ............... F17C 3/08
(Continued)

OTHER PUBLICATIONS

JP2016079823A English Machine Translation (Year: 2016).*
(Continued)

*Primary Examiner* — Len Tran
*Assistant Examiner* — Jenna M Hopkins (57) ABSTRACT

A cooling system, an apparatus for producing hyperpolarized samples, where the apparatus includes the cooling system, and a method for assembling and using the cooling system are disclosed. The cooling system includes a cryogenic chamber, a cooling plate, a sample sleeve, a thermal switch, and an interposer. Also, the cryogenic chamber includes a cryogenic fluid and the cooling plate is disposed in the cryogenic chamber, in contact with the cryogenic fluid. Further, the sample sleeve is configured to receive a sample. The sample sleeve is at least partially inserted in the cryogenic chamber. The thermal switch is disposed between the cooling plate and the sample sleeve. Moreover, the interposer is disposed between at least one of (i) the thermal switch and the cooling plate and (ii) the thermal switch and the sample sleeve. The interposer includes a gallium indium tin alloy.

21 Claims, 5 Drawing Sheets

(51) Int. Cl.
*F25D 29/00* (2006.01)
*F28F 13/00* (2006.01)
*F28F 21/08* (2006.01)
*G01N 1/42* (2006.01)
*G01N 35/00* (2006.01)
*G01R 33/28* (2006.01)
*G01R 33/31* (2006.01)

(52) U.S. Cl.
CPC .......... *F28F 21/085* (2013.01); *F28F 21/086* (2013.01); *G01N 1/42* (2013.01); *G01N 35/00* (2013.01); *G01R 33/282* (2013.01); *G01R 33/31* (2013.01); *F28F 2013/008* (2013.01)

(58) Field of Classification Search
CPC .... F17C 13/007; F17C 13/086; F17C 13/087; F17C 2270/0536; F25D 19/006; F25D 29/00; F25D 29/006; G01R 33/31; G01N 1/42
See application file for complete search history.

(56) References Cited

U.S. PATENT DOCUMENTS

| | | | | |
|---|---|---|---|---|
| 3,999,403 A * | 12/1976 | Bower | F17C 13/006 62/51.2 |
| 4,197,658 A * | 4/1980 | Fraser | F26B 5/06 34/92 |
| 4,578,963 A * | 4/1986 | Sitte | G01N 1/42 62/383 |
| 4,707,998 A * | 11/1987 | Linner | B01D 8/00 118/50.1 |
| 4,848,093 A * | 7/1989 | Simmonds | F17C 6/00 62/49.1 |
| 4,870,838 A * | 10/1989 | Zeamer | F17C 3/085 62/51.1 |
| 4,920,264 A * | 4/1990 | Becker | G01N 1/42 250/282 |
| 4,988,014 A * | 1/1991 | Varghese | F17C 3/08 220/560.1 |
| 5,170,930 A | 12/1992 | Dolbear et al. | |
| 5,237,825 A * | 8/1993 | Menzi | F17C 3/08 62/49.1 |
| 5,377,911 A * | 1/1995 | Bauer | B24C 1/003 239/128 |
| 5,647,228 A * | 7/1997 | Sager | B01L 7/00 62/49.2 |
| 5,857,341 A * | 1/1999 | Amakusa | B82Y 15/00 62/383 |
| 6,014,864 A * | 1/2000 | Owen | F25D 29/001 165/96 |
| 6,029,456 A * | 2/2000 | Zaiser | F17C 3/08 62/45.1 |
| 6,070,414 A * | 6/2000 | Ross | G01J 5/061 62/51.1 |
| 6,164,077 A * | 12/2000 | Feger | F25D 19/006 62/51.1 |
| 6,423,387 B1 * | 7/2002 | Zollinger | A61K 49/1815 220/592.2 |
| 7,278,278 B2 * | 10/2007 | Wowk | A01N 1/02 62/371 |
| 7,430,872 B2 * | 10/2008 | Strobel | F25D 19/006 62/259.2 |
| 7,631,507 B2 * | 12/2009 | Stautner | F25B 9/14 62/51.1 |
| 7,646,200 B2 * | 1/2010 | Slade | G01R 33/62 324/321 |
| 9,074,798 B2 * | 7/2015 | Ackermann | G01R 33/3804 |
| 9,234,691 B2 * | 1/2016 | Black | F17C 3/085 |
| 9,618,257 B2 * | 4/2017 | Black | F17C 3/085 |
| 9,682,533 B1 | 6/2017 | Gross | |
| 9,702,594 B2 * | 7/2017 | Vetrovec | F25B 21/00 |
| 9,927,154 B2 * | 3/2018 | King | F25D 19/006 |
| 10,101,420 B2 * | 10/2018 | Wikus | G01R 33/3815 |
| 10,184,711 B2 * | 1/2019 | Stautner | H01F 6/04 |
| 10,203,067 B2 * | 2/2019 | Strobel | F25D 19/006 |
| 10,436,481 B2 * | 10/2019 | Vetrovec | F25B 21/00 |
| 10,451,529 B2 * | 10/2019 | Schreibeis | G01N 21/255 |
| 10,481,222 B2 * | 11/2019 | Stautner | G01R 33/31 |
| 10,544,965 B2 * | 1/2020 | Vetrovec | F25B 21/00 |
| 10,591,557 B2 * | 3/2020 | Leach | G01R 33/282 |
| 10,692,631 B2 * | 6/2020 | Lee | F25D 19/006 |
| 2002/0147396 A1 * | 10/2002 | Fleury | G01R 33/31 600/410 |
| 2002/0162351 A1 * | 11/2002 | Findley | F17C 3/02 62/434 |
| 2004/0049108 A1 * | 3/2004 | Ardenkjaer-Larsen | G01R 33/282 600/412 |
| 2004/0066193 A1 * | 4/2004 | Ardenkjaer-Larsen | G01R 33/282 324/309 |
| 2005/0225328 A1 * | 10/2005 | Ardenkjaer-Larsen | G01R 33/282 324/321 |
| 2005/0283230 A1 * | 12/2005 | Joshi | F25D 19/006 623/1.44 |
| 2006/0101832 A1 * | 5/2006 | Wurzinger | A01N 1/02 62/51.1 |
| 2008/0100293 A1 * | 5/2008 | Lucas | G01R 33/62 324/307 |
| 2008/0242974 A1 * | 10/2008 | Urbahn | F25B 9/14 600/420 |
| 2009/0126922 A1 * | 5/2009 | Vetrovec | F21V 29/70 165/185 |
| 2009/0146294 A1 * | 6/2009 | Hillman | H01L 23/42 257/714 |
| 2010/0071883 A1 * | 3/2010 | Vetrovec | F28D 15/00 165/121 |
| 2010/0242500 A1 * | 9/2010 | Laskaris | F28D 15/02 62/51.1 |
| 2011/0168247 A1 | 7/2011 | Guha et al. | |
| 2011/0180238 A1 * | 7/2011 | Vetrovec | F28D 15/00 165/104.28 |
| 2011/0219785 A1 * | 9/2011 | Black | F17C 13/007 62/3.1 |
| 2012/0011859 A1 * | 1/2012 | Black | G01F 23/263 62/48.1 |
| 2012/0117985 A1 * | 5/2012 | Urbahn | G01N 13/00 62/45.1 |
| 2013/0047633 A1 * | 2/2013 | Leach | G01R 33/282 62/51.1 |
| 2013/0160975 A1 * | 6/2013 | Stautner | F28D 15/00 165/104.22 |
| 2013/0186745 A1 | 7/2013 | Nanis | |
| 2014/0123681 A1 * | 5/2014 | Urbahn | F25B 9/14 62/3.1 |
| 2014/0263588 A1 | 9/2014 | Zhong et al. | |
| 2015/0075183 A1 * | 3/2015 | Hirsch | G01R 33/282 62/3.1 |
| 2015/0084632 A1 * | 3/2015 | Wilhelm | G01R 33/5605 324/318 |
| 2015/0099110 A1 | 4/2015 | Bellman et al. | |
| 2015/0102498 A1 | 4/2015 | Enicks et al. | |
| 2018/0259128 A1 * | 9/2018 | Bassetto | F17C 3/08 |
| 2019/0025387 A1 * | 1/2019 | Stautner | F25D 21/002 |
| 2019/0041103 A1 * | 2/2019 | Kelly | F25D 19/006 |
| 2020/0182517 A1 * | 6/2020 | Vetrovec | F25B 21/00 |

FOREIGN PATENT DOCUMENTS

| | | | |
|---|---|---|---|
| FR | 1312779 A * | 12/1962 | .......... A01N 1/0205 |
| FR | 2853050 A1 * | 10/2004 | .......... F17C 13/006 |
| GB | 824702 A * | 12/1959 | .......... F17C 3/08 |
| GB | 1194621 A * | 6/1970 | .......... F17C 13/00 |
| GB | 1196820 A * | 7/1970 | .......... G01R 33/30 |

(56) References Cited

FOREIGN PATENT DOCUMENTS

| JP | 60073198 A | * | 4/1985 | ............... F17C 3/08 |
|----|------------|---|--------|---------------------------|
| JP | 2016079823 A | * | 5/2016 | |

OTHER PUBLICATIONS

Galinstan—Bhattacharya (Nov. 8, 2014) (Year: 2014).*
Reynolds et al.,"The use of gallium as a thermal contact agent at low temperature", Cryogenics. Nov. 1976, 1 Page.
J.T.C. Yeh .,"Mechanical properties of In-based eutectic alloy solders used in Josephson packaging", CRYOGENICS. May 1984, pp. 261-265.
Gmelin et al., "Thermal boundary resistance of mechanical contacts between solids at sub-ambient temperatures", J. Phys. D. Appl. Phys., vol. 32, 1999, pp. R19-R43.
Liu et al., "Characterization of Nontoxic Liquid-Metal Alloy Galinstan for Applications in Microdevices", Journal of Microelectromechanical Systems, http://ieeexplore.ieee.org/abstract/document/6097006/, vol. 21, Issue 02, Apr. 2012, pp. 443-450.
Hernandez et al., "Through Si Vias Using Liquid Metal Conductors for Re-Workable 3D Electronics", Electronic Components and Technology Conference, http://ieeexplore.ieee.org/abstract/document/6575756/, May 28-31, 2013, pp. 1401-1406.
Lam et al.,"Analysis of Galinstan-Based Microgap Cooling Enhancement Using Structured Surfaces",Journal of Heat Transfer, Sep. 2015, vol. 137, pp. 091003-1-10.
Lin et al., "Drawing Liquid Metal Wires at Room Temperature", Extreme Mechanics Letters, http://www.sciencedirect.com/science/article/pii/S235243161630075X, , Jun. 2016, vol. 07, pp. 53-63.

* cited by examiner

THERMAL INTERPOSER FOR A CRYOGENIC COOLING SYSTEM

BACKGROUND

Embodiments of the present specification relate generally to cooling systems, and more particularly to a cryogenic cooling system having a thermal interposer and method for assembling and using the cryogenic cooling system.

Sensitivity of nuclear magnetic resonance (NMR) systems, such as magnetic resonance imaging (MM) systems, are often limited due to the normally very low polarization of the nuclear spins of samples being used. A number of techniques exist to improve the polarization of nuclear spins in the solid phase. Dynamic nuclear polarization (DNP) is a technique that is used to generate an excess of a nuclear spin orientation relative to other spin orientations, which may sometimes be referred to as hyperpolarization. The excess of one spin orientation over another is reflected by an increase in the signal-to-noise ratio of measurements in the NMR systems. During imaging, a polarized metabolic imaging agent sample is introduced or injected into the subject being imaged. The DNP technique leads to an increase in sensitivity during imaging. DNP often involves cooling the sample to particularly low temperatures. For instance, DNP systems may include liquid cryogen (e.g., liquid helium) baths to cool the sample to very low temperatures, sometimes below four Kelvin.

It is desirable to construct a cooling system such that a thermal contact between a sample sleeve carrying the sample and cooling parts (for example, a cooling plate) of the cooling system is maximized to facilitate a minimum thermal difference between the sample sleeve and the cooling plate. It may be desirable to achieve good thermal contact in absence of an externally applied pressure on contact surfaces. It may be further desirable to achieve good thermal contact in absence of a permanent bonding between the contact surfaces.

Indium is used in conventional cooling systems as a thermal interposer material between cooling surfaces. However, indium requires a high pressure to be applied at the contact surfaces from room temperature down to cryogenic temperatures to balance thermal shrinkage of indium during cooling. Further, the pressure applied to the contact surfaces may have to be varied across the temperature ranges to obviate creep related contact issues of indium. Grease or other similar materials, when used as a thermal interposer material, require flat contact surfaces.

BRIEF DESCRIPTION

In one aspect, a cooling system is disclosed. The cooling system includes a cryogenic chamber, a cooling plate, a sample sleeve, a thermal switch, and an interposer. The cryogenic chamber includes a cryogenic fluid and the cooling plate is disposed in the cryogenic chamber, in contact with the cryogenic fluid. The sample sleeve is configured to receive a sample. The sample sleeve is at least partially inserted in the cryogenic chamber. The thermal switch is disposed between the cooling plate and the sample sleeve. The interposer is disposed between at least one of (i) the thermal switch and the cooling plate and (ii) the thermal switch and the sample sleeve. The interposer includes a gallium indium tin alloy.

In another aspect, an apparatus for producing hyperpolarized samples for use in a magnetic resonance imaging (MRI) is disclosed. The apparatus includes a nuclear magnetic resonance (NMR) coil, a waveguide, and a cooling system. The cooling system includes a cryogenic chamber, a cooling plate, a sample sleeve, a thermal switch, and an interposer. The cryogenic chamber includes a cryogenic fluid. The cooling plate is in the cryogenic chamber, and is in contact with the cryogenic fluid. The cooling plate has a top surface that includes copper. The sample sleeve is configured to receive a sample. The sample sleeve is at least partially inserted in the cryogenic chamber and has a bottom surface that includes copper. The thermal switch is disposed between the top surface of the cooling plate and the bottom surface of the sample sleeve. The thermal switch includes a top surface having copper and a bottom surface having copper. The interposer is disposed between at least one of (i) the bottom surface of the thermal switch and the top surface of the cooling plate and (ii) the top surface of the thermal switch and the bottom surface of the sample sleeve. The interposer includes a gallium indium tin alloy. The cooling system is configured to cool a sample to a temperature less than 2K.

In yet another aspect, a method is disclosed. The method includes assembling a cooling system. Assembling the cooling system includes disposing a cryogenic chamber having a cryogenic fluid, disposing a cooling plate in the cryogenic chamber such that the cooling plate is in contact with the cryogenic fluid, at least partially inserting a sample sleeve in the cryogenic chamber, disposing a thermal switch between the cooling plate and the sample sleeve; and disposing an interposer between at least one of (i) the thermal switch and the cooling plate, and (ii) the thermal switch and the sample sleeve. The interposer includes a gallium indium tin alloy.

DRAWINGS

These and other features, aspects, and advantages of the present specification will become better understood when the following detailed description is read with reference to the accompanying drawings in which like characters represent like parts throughout the drawings.

DETAILED DESCRIPTION

One or more specific embodiments of the present specification will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this specification.

When introducing elements of various embodiments of the present specification, the articles "a," "an," "the," and "said" are intended to mean that there are one or more of the elements. The terms "comprising," "including," and "having" are intended to be inclusive and mean that there may be additional elements other than the listed elements.

The present specification provides a cooling system such that a thermal contact between a sample to be polarized and cooling parts of the cooling system is maximized. The thermal contact may be maximized if a thermal difference ($\Delta T$) between contact surfaces thermally connecting the sample and a cooling medium is less than 0.1K, in absence of application of any external pressure on the contact surfaces. The cooling system disclosed herein includes a cryogenic chamber, a cooling plate, a sample sleeve, a thermal switch, and an interposer. The cryogenic chamber includes a cryogenic fluid and the cooling plate is disposed in the cryogenic chamber, in contact with the cryogenic fluid. The sample sleeve is configured to receive the sample. The sample sleeve is at least partially inserted in the cryogenic chamber. The thermal switch is disposed between the cooling plate and the sample sleeve. The interposer is a thermal interposer disposed between at least one of (i) the thermal switch and the cooling plate and (ii) the thermal switch and the sample sleeve. The interposer includes a gallium indium tin alloy.

Figure 1A:
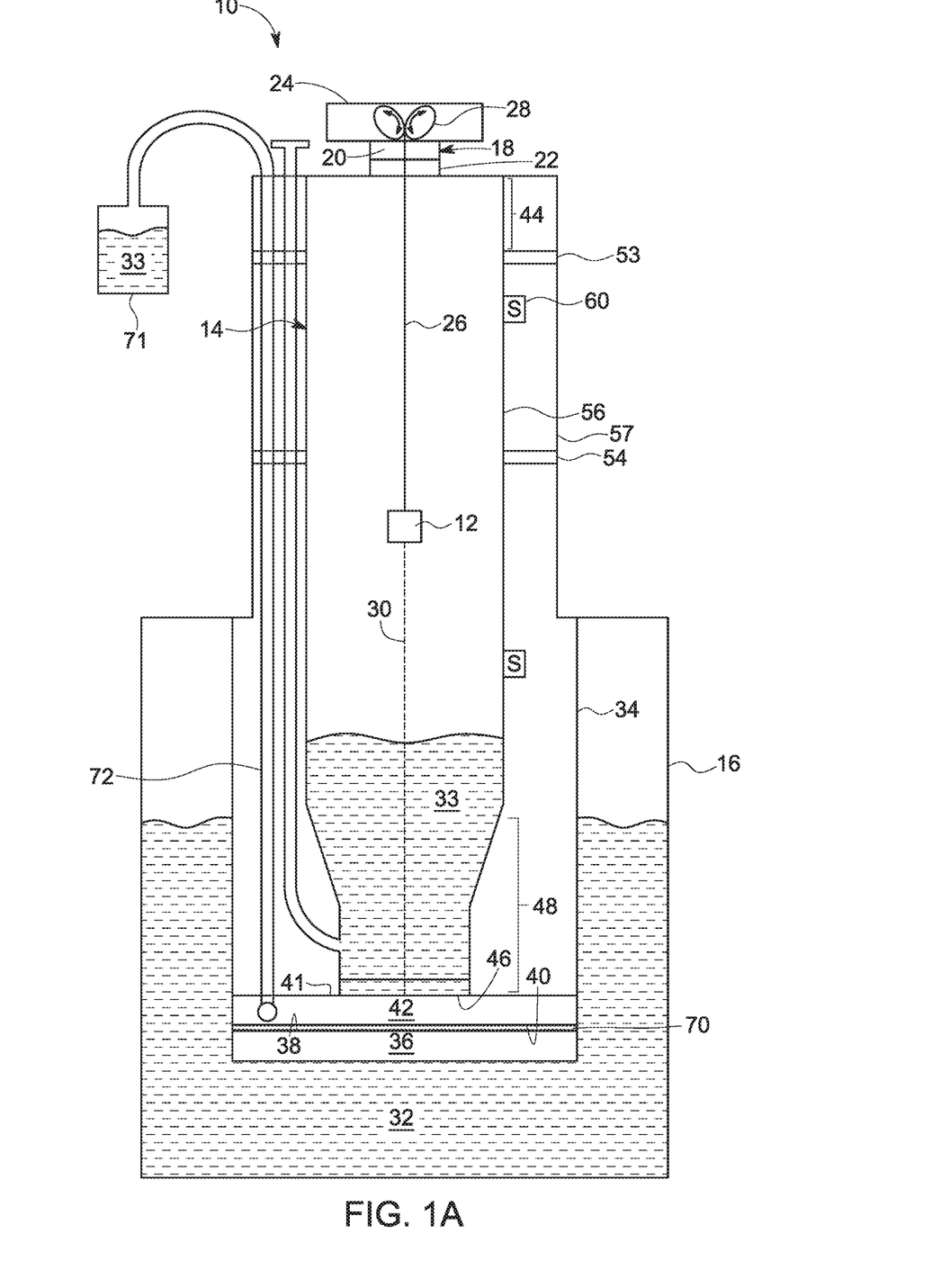
FIG. 1A is a schematic cross-sectional diagram of a cooling system that includes an interposer between a cooling plate and a thermal switch, in accordance with some embodiments of the present specification.

FIG. 1A is a schematic diagram of a cooling system 10, in accordance with some embodiments of the present specification. The cooling system 10 is used to cool one or more samples 12 disposed inside a sample sleeve 14. The cooling system 10 may be included in a dynamic nuclear polarization (DNP) system (not shown in FIG. 1A). The sample 12 may include chemical compounds, solutions, and the like. For example, the sample 12 may include pyruvate, pyruvic acid, urea, uric acid, glycerol, or any combinations thereof.

The cooling system 10 includes a cryogenic chamber 16 (e.g., a liquid cryogen bath) having a cryogenic fluid 32 to cool the sample 12 during operation of the cooling system 10 and an airlock chamber 18 to facilitate transitioning of the sample 12 from a room temperature environment to an environment present in the cooling system 10. The airlock chamber 18 may further be used to maintain the sample 12 at a suitable pressure. For instance, in some cases, the airlock chamber 18 may be utilized to keep the sample at a pressure that is lower than standard atmospheric pressure. The airlock chamber 18 may include a baffle 20 and gate valve 22 that aid in maintaining a certain pressure within the airlock chamber 18 of the cooling system 10.

Moreover, the cooling system 10 may also include a positioning system 24 that may be used to move the sample 12 within the cooling system 10. For instance, the sample 12 may be coupled to a connector 26 (e.g., a hollow tube, cable, string), and the connector 26 may be coupled to pitch wheels 28 of the positioning system 24. Rotation of the pitch wheels 28 causes the sample 12 to be moved along a sample path 30 toward and away from the cryogenic chamber 16.

The sample 12 may be cooled within the cooling system 10 via heat transfer using convection and/or conduction. For example, as the sample 12 is moved closer to the cryogenic chamber 16 but not in physical contact with a cryogenic fluid 32, the cooling of the sample 12 may occur by way of convection. Further, as the sample 12 is placed in thermal contact with the cryogenic fluid 32, the cooling of the sample 12 may occur via conduction.

In addition to the cryogenic fluid 32, the cryogenic chamber 16 includes a sample pot 34 and a cooling plate 36. The sample pot 34 forms an enclosed volume within the cryogenic chamber 16. The sample pot 34 may be thermally insulated to maintain a constant temperature within the sample pot 34. By way of a non-limiting example, in certain embodiments, the temperature in the sample pot 34 is less than 1 K. More specifically, in certain embodiments the temperature in the sample pot 34 is in a range from about 0.75 K to about 0.95 K. Moreover, a portion of the sample pot 34 may directly contact the cryogenic fluid 32 that is stored within the cryogenic chamber 16.

The cooling plate 36 aids in cooling the sample pot 34. In some embodiments, the cooling plate 36 may be a surface of the sample pot 34 or form the bottom of the sample pot 34. In some embodiments, the cooling plate 36 may not be a separate component from the sample pot 34. As illustrated, in certain embodiments, the cooling plate 36 may be in contact with the cryogenic fluid 32 of the cryogenic chamber 16 such that all but one surface of the cooling plate 36 are surrounded by the cryogenic fluid 32. In the illustrated embodiment, the surface that is not in contact with the cryogenic fluid 32 is represented by reference numeral 38. The surface 38 of the cooling plate 36 contacts a surface 40 of a thermal switch 42 disposed in between the cooling plate 36 and the sample sleeve 14. The cooling plate 36 may also cool the thermal switch 42. By way of example, the cooling plate 36 may be used to remove heat from the thermal switch 42.

The thermal switch 42 may be used as a switch that can limit a flow of thermal energy through the switch. For example, the thermal switch 42 may be operated in an "ON" state to allow the thermal energy to pass through. Also, in some other embodiments, the thermal switch may be in an "OFF" state without allowing substantial thermal energy to pass through the body of the thermal switch. For example, the thermal switch 42 may be operated in an "OFF" state at the time of heating up the sample sleeve 14, without removing the sample sleeve 14 from the cooling system 10. The sample sleeve 14 may be heated in the cooling system 10 to remove some minor contaminants such as a little ice formed in the sample sleeve 14. By operating the thermal switch 42 in an "OFF" state when the temperature of the sample sleeve 14 is increased, the thermal energy passing through the thermal switch 42 to the sample pot 34 is effectively avoided and the low temperature prevailing in the sample pot 34 is preserved.

Turning now to the sample sleeve 14, the sample sleeve 14 may be positionable within the cooling system 10. The sample sleeve 14 has a geometry and size appropriate for the cooling system 10. The sample sleeve includes an upper portion 44, a lower portion 48, and an outer wall 56. The lower portion 48 of the sample sleeve 14 is in thermal communication with the thermal switch 42. Additionally, the lower portion 48 of the sample sleeve 14 includes a cryogenic fluid 33 separated from the cryogenic fluid 32 that is present in the cryogenic chamber 16 and outside of the sample pot 34. The cryogenic fluid 32 in the cryogenic chamber 16 and the cryogenic fluid 33 may of same material or may be different from one another. The sample sleeve 14 defines the sample path 30 for the sample 12 within the cooling system 10. The sample path 30 is isolated from other parts of the cooling system 10, such as the cryogenic fluid 32 disposed in the cryogenic chamber 16 that is outside of the sample pot 34. The sample 12 may be raised and lowered (e.g. via the positioning system 24) within the sample sleeve 14 in the sample path 30. The sample 12 may be moved into the cryogenic fluid 33 contained in the lower portion 48 of the thermal sleeve to conductively cool the sample 12. The sample sleeve 14 may be secured in place to an outer tube 57 that surrounds the sample sleeve 14 via a first set of links 53 and a second set of links 54 connecting the outer wall 56 of the sample sleeve 14 to the outer tube 57.

Generally, the temperature within the cooling system 10 is lower in areas closer to, and within, the cryogenic chamber 16. For example, the temperature in the area of the cooling system 10 between the gate valve 22 and the first set of links 53 (i.e., upper portion 44 of the sample sleeve 14 is generally about 40 K or warmer. The temperature in the area between the first set of links 53 and the second set of links 54 generally ranges from about 4 K to about 40 K. Further, in certain embodiments, the temperature in the sample pot 34, in which the lower portion 48 of the sample sleeve 14 is positioned, may be less than about 2 K. Consequently, as the sample 12 is lowered along the sample path 30 toward and in the sample pot 34, the sample 12 is subjected to increasingly lower temperatures. In some embodiments, the temperature in the sample pot 34, in which the lower portion 48 of the sample sleeve 14 is positioned, is less than 2 K.

The sample 12 may be in a solid or liquid form. In some embodiments, the sample 12 is disposed in a container, such as but not limited to, a vial, syringe, or some other form of encasement. In some instances, such as when the container in which the sample 12 is disposed is lowered quickly into the sample pot 34, the container of the sample 12 may mechanically fail. For instance, when the container of the sample 12 is lowered at a speed above a determined threshold value, the container may break, causing the contents of the sample 12 to disperse within the cooling system 10. However, such a dispersion of the sample 12 is limited to occurring within the sample sleeve 14. Accordingly, advantageously, the sample sleeve 14 prohibits the sample 12 from entering any portion of the cooling system 10 that is outside of the sample sleeve 14, which reduces or eliminates the likelihood of contaminating the sample pot 34. In some embodiments, the sample sleeve 14 may be removed or replaced from the cooling system 10 to clean the sample sleeve 14, or for any other operational requirements. Therefore, in some embodiments, the sample sleeve 14 is removably disposed in the cooling system 10.

The thermal switch 42 may be used to heat or cool the sample sleeve 14. For example, the thermal switch 42 may heat a surface 46 of the sample sleeve 14. More specifically, temperature of the thermal switch 42 may increase in response to an applied stimulus (e.g., electrical signal or gas flow through the thermal switch 42), and the heat generated in the thermal switch 42 may be transferred from a surface 41 of the thermal switch 42 to the surface 46 of the sample sleeve 14 (e.g., via conduction). The transfer of heat from the surface 41 of the thermal switch 42 to the surface 46 may lower the temperature of the lower portion 48 of the sample sleeve 14, thereby causing de-icing to occur in the cryogenic fluid 33 inside the sample sleeve 14 without the need for removing the sample sleeve 14 from the cooling system 10. The thermal switch 42 may also aid in the cooling of the sample pot 34 and/or the removable sample sleeve 14. For example, the thermal switch 42 may receive the cryogenic fluid 33 from an external source 71 through a connecting tube 72 for cooling the thermal switch 42, the sample pot 34, and/or the removable sample sleeve 14.

In some embodiments, the sample sleeve 14 may be removably attached to the sample pot 34 through the thermal switch 42. The removable attachment of the sample sleeve 14 aids in removing the sample sleeve 14 from the cooling system 10 as and when required. In some embodiments, the sample sleeve 14 is removably attached to the cooling plate 36 via the thermal switch 42. In some embodiments, the thermal switch 42 is removably attached to the surface 46 of the sample sleeve 14. In some other embodiments, the thermal switch 42 is permanently attached to the sample sleeve 14, and the thermal switch 42 is removably attached to the cooling plate 36 so that the sample sleeve 14 may be removed along with the thermal switch 42 from the cooling system 10.

Figure 1B:
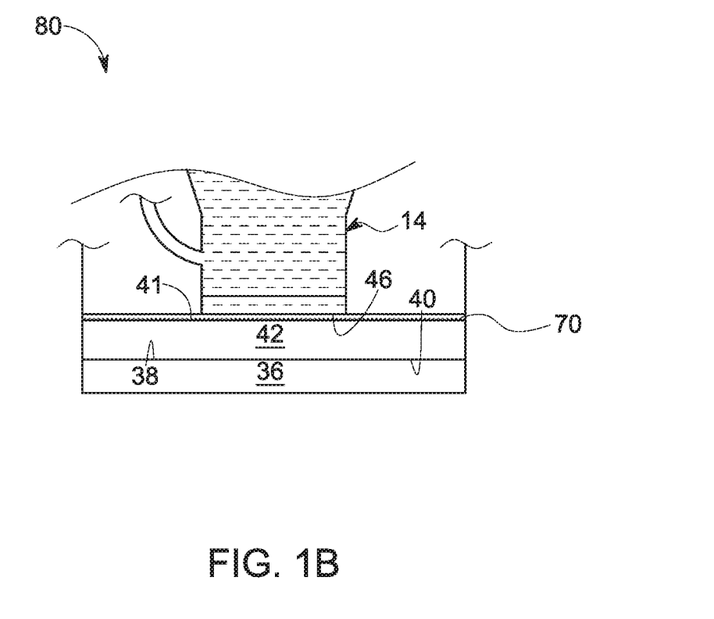
FIG. 1B is a schematic cross-sectional diagram an alternative embodiment of a portion of the system of FIG. 1A having the interposer between the thermal switch and a sample sleeve, in accordance with some embodiments of the present specification.

In some embodiments, an interposer 70 is disposed between two adjoining surfaces having high thermal conductivity to reduce thermal resistance between the surfaces. The interposer 70 is configured to act as a thermal interposer to enhance the temperature match between the two adjoining surfaces that have high thermal conductivity. By way of example, the thermal switch 42 may be removably attached to the sample sleeve 14 or the cooling plate 36 through the interposer 70 as depicted in FIGS. 1A and 1B. In the embodiment of FIG. 1A, the interposer 70 is disposed between the thermal switch 42 and the cooling plate 36. In some embodiments, the interposer 70 further enables removable attachment of the surfaces connecting thermally through the interposer 70. By way of example, the interposer 70 enables removable attachment of the sample sleeve 14 and the cooling plate 36. The interposer 70 includes a gallium indium tin alloy. Referring now to FIG. 1B, a portion 80 of the cooling system 10 of FIG. 1A is depicted. In FIG. 1B, the interposer 70 is disposed between the thermal switch 42 and the sample sleeve 14.

A gallium indium tin alloy is distinct from elemental gallium and a gallium indium alloy that does not include tin. Both gallium and gallium indium alloys are known to cause health hazards and hence, may not be readily suitable for use in a medical application. Gallium indium tin alloy is found to be an industrially applicable, medically safe Rohs compliant material and experimentally verified by the inventors as a suitable interposer material for the cooling system 10.

In some embodiments, the interposer 70 includes greater than 90 weight % of gallium indium tin alloy. In certain embodiments, the interposer 70 includes more than 95 weight % of gallium indium tin alloy. In yet another embodiment, the interposer 70 is made of the gallium indium alloy. The gallium indium alloy may be used in various compositional forms. In some embodiments, the gallium indium tin alloy of the interposer 70 includes gallium in an amount in a range from about 60 atomic % to about 75 atomic %, indium in an amount in a range from about 15 atomic % to about 25 atomic %, and tin in an amount in a range from about 10 atomic % to about 15 atomic %. In some embodiments, the gallium indium tin alloy in the interposer 70 is used in its eutectic composition having about 66.71 atomic % of gallium, 20.38 atomic % of indium, and 12.91 atomic % of tin. The eutectic gallium indium tin alloy is in a liquid state at room temperature and solidifies at around 16° C.

In some embodiments, the interposer 70 is disposed between a first surface of the thermal switch 42 and a first surface of the cooling plate 36. For simplicity and ease of relating to the illustrations of FIGS. 1A and 1B, a first surface of the thermal switch 42 is referred to as a bottom surface 40 of the thermal switch 42 and a first surface of the cooling plate 36 is referred to as a top surface 38 of the cooling plate 36. In some embodiments where the interposer 70 is disposed between the thermal switch 42 and the sample sleeve 14, the interposer 70 is disposed between a second surface of the thermal switch 42 and a first surface of the sample sleeve 14. While referring to FIGS. 1A and 1B, the second surface of the thermal switch 42 is referred to as a top surface 41 of the thermal switch 42 and the first surface of the sample sleeve 14 is referred to as a bottom surface 46 of the sample sleeve 14. In some embodiments, the interposer 70 is disposed between the bottom surface 40 of the thermal switch 42 and the top surface 38 of the cooling plate 36, as illustrated in FIG. 1A. In some other embodiments, the interposer 70 is disposed between top surface 41 of the thermal switch 42 and the bottom surface 46 of the sample sleeve 14, as illustrated in FIG. 1B. It should be appreciated that the terminologies such as the "top surface" and the "bottom surface" used herein are only for illustration purposes and do not limit the surfaces to be a horizontal surface.

In certain embodiments, wetting of the adjoining surfaces by the interposer 70 is desirable to reduce the thermal resistance between the adjoining surfaces disposed on either side of the interposer 70. Any suitable thermal conductor demonstrating wetting with the interposer material may be used for the surfaces contacting the interposer 70. Non-limiting examples of a thermal conductor include copper and gold. In the embodiments where the interposer 70 is disposed between the bottom surface 40 of the thermal switch 42 and the top surface 38 of the cooling plate 36, the bottom surface 40 of the thermal switch 42 includes copper and the top surface 38 of the cooling plate 36 includes copper. In some embodiments where the interposer 70 is disposed between top surface 41 of the thermal switch 42 and the bottom surface 46 of the sample sleeve 14, the top surface 41 of the thermal switch 42 includes copper and the bottom surface 46 of the sample sleeve 14 includes copper.

As used herein, a surface is said to have copper if the surface includes copper. In some embodiments, as discussed above, copper is used for a high thermal conductivity through the surface. Therefore, in some embodiments, the surface having copper has a suitable amount of copper content to effectively reduce thermal resistance when thermal energy is passed from that surface to another surface. In some embodiments, the copper content of a surface having copper is greater than 90 atomic percent of the surface. In some other embodiments, the copper content of a surface having copper is greater than 95 atomic percent. In yet another embodiment, the surface having copper is substantially made of copper such that the surface does not have any other elements that are intentionally added to increase any functional property of the surface or the component having the surface. Copper may be incorporated on the top or bottom surfaces 41, 40 of the thermal switch 42, the bottom surface 46 of the sample sleeve 14, or the top surface 38 of the cooling plate 36 by various coating methods. In one example embodiment, the copper is sputtered on the required surface of the thermal switch 42, the sample sleeve 14, or the cooling plate 36.

As described above, in some embodiments, the thermal switch 42 may be further used to impart thermal energy to the interposer 70 for liquifying the interposer 70 and releasing the surfaces that may be contacting the interposer 70. The thermal switch 42, the cooling plate 36, and the sample sleeve 14 may be made of any suitable materials having mechanical, electrical, or thermal properties suitable for their construction and operation. In some embodiments, the thermal switch 42 includes a nickel-chromium super alloy, stainless steel, a titanium alloy, or combinations thereof. A non-limiting example of a nickel-chromium super alloy that is suitable to be used as the thermal switch 42 is an Inconel® alloy. In another non-limited example, an additively manufactured titanium aluminum vanadium-based low interstitial alloy $TiAl_6V_4$ is used as the thermal switch 42.

In the illustration showed FIG. 1A, the thermal switch 42 is attached to the sample sleeve 14 and the interposer 70 is disposed between the thermal switch 42 and the cooling plate 36. The thermal switch 42 may be permanently or removably attached to the sample sleeve 14. In some embodiments, the sample sleeve 14 includes a nickel-chromium super alloy, stainless steel, a titanium alloy, or combinations thereof. Also, in some embodiments, the sample sleeve 14 is made of a nickel-chromium super alloy, stainless steel, a titanium alloy, or combinations thereof. Example methods for attaching the thermal switch 42 to the sample sleeve 14 include, but are not limited to, brazing, welding, and integrated manufacturing, such as, for example additive manufacturing. In embodiments where the thermal switch 42 is attached to the sample sleeve 14, the top surface 41 of the thermal switch 42 and the bottom surface 46 of the sample sleeve 14 may not include copper.

In the illustration showed in FIG. 1B, the thermal switch 42 is attached to the cooling plate 36 and the interposer 70 is disposed between the thermal switch 42 and the sample sleeve 14. The thermal switch 42 may be permanently or removably attached to the cooling plate 36. In some embodiments, the cooling plate 36 includes a nickel-chromium super alloy, stainless steel, a titanium alloy, or combinations thereof. In some embodiments, the cooling plate 36 is made of a nickel-chromium super alloy, a stainless steel, a titanium alloy, or combinations thereof. Example methods for attaching the thermal switch 42 to the cooling plate 36 include, but are not limited to, brazing, welding, and integrated manufacturing. In some embodiments having thermal switch 42 attached to the cooling plate 36, the bottom surface 40 of the thermal switch 42 and the top surface 38 of the cooling plate 36 may not include copper.

In some embodiments, the cooling system 10 is associated with a dynamic nuclear polarization (DNP) system (not shown in FIGS. 1A and 1B). In these embodiments, the cooling system 10 is configured to cool the sample 12 to a temperature suitable to facilitate dynamic nuclear polarization of the sample 12 disposed inside the sample sleeve 14. In some embodiments, the temperature suitable for dynamic nuclear polarization is less than 2 K. In some embodiments, the cryogenic fluid 33 includes liquid helium to cool the sample 12 to temperatures suitable for dynamic nuclear polarization of the sample 12. The cooling plate 36 serves as a thermal barrier between the thermal switch 42, the surrounding sample pot 34, and the cryogenic fluid 32, which limits heating of the sample pot 34 and the cryogenic fluid 32 by the thermal switch 42 during removal of the sample sleeve 14 or during de-icing procedures for the cryogenic liquid 33. In some embodiments, the cryogenic fluid 32 may include helium.

Introduction of the sample 12, warming of the interposer 70 using the thermal switch 42, and similar procedures may be controlled and adjusted in response to certain detected parameters of the cooling system 10. To provide for such control, in some embodiments, the cooling system 10 may include one or more sensors 60 that detect various properties of the cooling system 10 such as temperature, pressure, and a polarization status of the sample 12. As noted above, the cooling system 10 may be used for DNP applications. In some embodiments, an apparatus 200 for producing hyperpolarized samples using a DNP technique for use in a magnetic resonance imaging (MRI) system is disclosed, as schematically illustrated in a cross-sectional view in FIG. 2.

Figure 2:
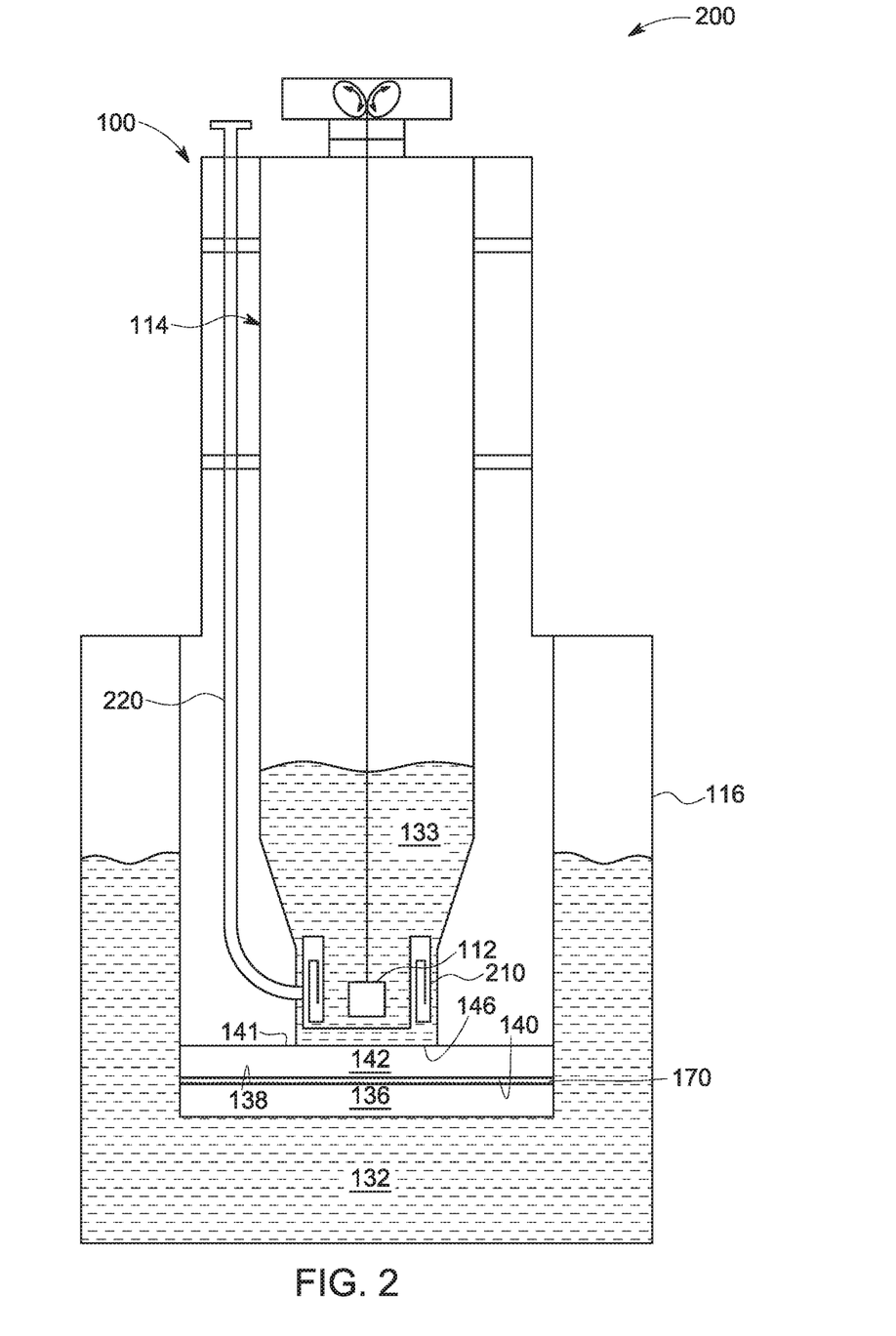
FIG. 2 is a schematic cross-sectional diagram of an apparatus including a cooling system, where the apparatus is configured to produce hyperpolarized samples using a dynamic nuclear polarization technique, in accordance with some embodiments of the present specification.

The apparatus 200 includes a cooling system 100. The cooling system 100 is similar to the cooling system 10 illustrated in FIG. 1A or 1B. The cooling system 100 includes a cryogenic chamber 116, a cooling plate 136, a sample sleeve 114, a thermal switch 142, and an interposer 170. The cryogenic chamber 116 includes a cryogenic fluid 132 in the cryogenic chamber 116 and a cryogenic fluid 133 inside the sample sleeve 114. In some embodiments, helium is used as the cryogenic fluid 132 and 133. The cooling plate 136 is in the cryogenic chamber 116, and is in contact with the cryogenic fluid 132. The cooling plate 136 has a top surface 138 that includes copper. The sample sleeve 114 is configured to receive a sample 112. The sample sleeve 114 is at least partially inserted in the cryogenic chamber 116 and has a bottom surface 146 that includes copper. The thermal switch 142 is disposed between the top surface 138 of the cooling plate 136 and the bottom surface 146 of the sample sleeve 114. The thermal switch 142 includes a top surface 141 having copper and a bottom surface 140 having copper. The interposer 170 is disposed between at least one of (i) the bottom surface 140 of the thermal switch 142 and the top surface 138 of the cooling plate 136 and (ii) the top surface 141 of the thermal switch 142 and the bottom surface 146 of the sample sleeve 114. The interposer 170 includes a gallium indium tin alloy. The cooling system 100 is configured to cool a sample to a temperature less than 2 K.

The apparatus 200 may further include components used to perform DNP. For example, in the illustrated embodiment, the apparatus 200 includes a nuclear magnetic resonance (NMR) coil 210 and a waveguide 220. The sample 112 may be placed within the NMR coil 210, as shown in the cross-sectional view depicted in FIG. 2. Further, data corresponding to the sample 112 may be collected and recorded by an associated electronic system (not shown in FIG. 2). During operation of the apparatus 200, electromagnetic radiation (e.g., microwaves) produced by the NMR coil 210 may be directed towards the sample 112 and resultant radiation may be received by the NMR coil 210. The waveguide 2220 may be used to guide the electromagnetic radiation to and/or from the NMR coils 210. The interposer 170 aids in enhanced heat transfer between the cryogenic fluid 133 in the sample sleeve 114 and the sample 112 when a thermal difference between the cooling plate 136 and the sample sleeve 114 is less than 0.1 K. In some embodiments of the apparatus 200, the sample sleeve 114 is removably attached to the cooling plate 136 via the thermal switch 142. The interposer 170 aids in removably attaching the sample sleeve 114 to the cooling plate 136 through the thermal switch 142. In some embodiments, the thermal switch 142 includes a nickel-chromium super alloy, a stainless steel, a titanium alloy, or combinations thereof. The hyperpolarized samples obtained by the DNP technique via use of the apparatus 200 may be used in a MRI system. In certain embodiments, the sample 112 may be subjected to further optional treatments prior to use by the MRI system.

Figure 3:
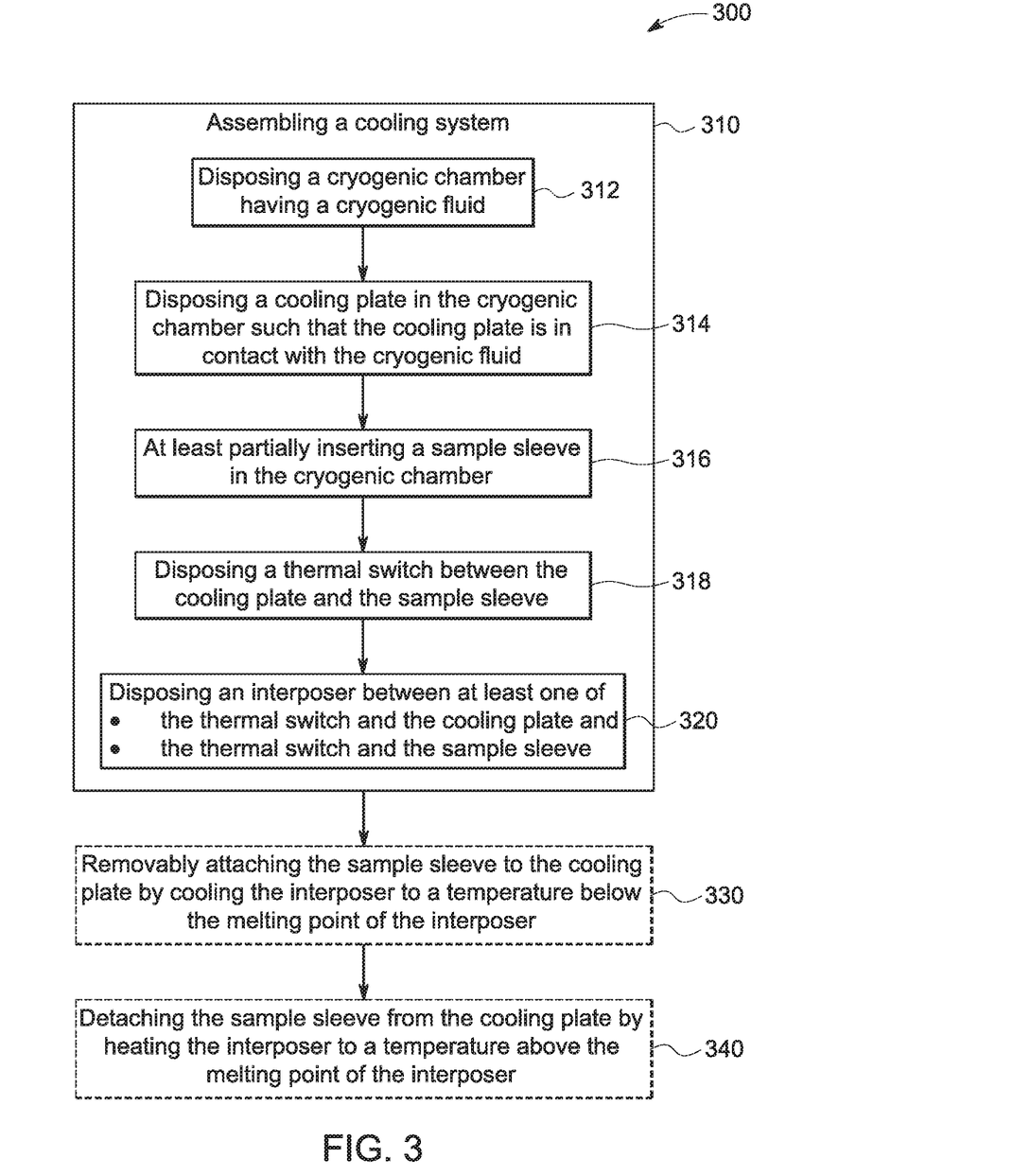
FIG. 3 is a flow chart of a method for assembling and using the cooling system of FIG. 1A or 1B, in accordance with some embodiments of the present specification.

FIG. 3 illustrates a flow chart of an example method 300. The method 300 includes a step 310 of assembling a cooling system, such as the cooling system 10 of FIG. 1A or 1B or the cooling system 100 of FIG. 2. Step 310 of the method 300 is discussed with respect to FIG. 1A or 1B. Also, step 310 includes a plurality of steps 312-320.

At step 312, the cryogenic chamber 16 having the cryogenic fluid 32 is disposed in the cooling system 10. At step 314, the cooling plate 36 is disposed in the cryogenic chamber 16 such that the cooling plate 36 is in contact with the cryogenic fluid 32 present in the cryogenic chamber 16. The method 300 of assembling the cooling system 10 further includes a step 316 of at least partially inserting a sample sleeve 14 in the cryogenic chamber 16. Subsequently, at step 318 a thermal switch 42 is disposed between the cooling plate 36 and the sample sleeve 14. At step 320, the interposer 70 is disposed between at least one of (i) the thermal switch 42 and the cooling plate 36 and (ii) the thermal switch 42 and the sample sleeve 14. The interposer 70 includes a gallium indium tin alloy.

In some embodiments, prior to the step 320 of disposing the interposer 70, the method 300 may optionally include a step of sputtering copper on surfaces adjoining the interposer 70. In one example, copper may be sputtered on the bottom surface 40 of the thermal switch 42 and on the top surface 38 of the cooling plate 36, prior to disposing the interposer 70 between the thermal switch 42 and the cooling plate 36. In another example, copper is sputtered on the top surface 41 of the thermal switch 42 and on the bottom surface 46 of the sample sleeve 14, prior to disposing the interposer 70 between the thermal switch 42 and the sample sleeve 14.

In some embodiments, the method 300 further includes an optional step 330 of removably attaching the sample sleeve 14 to the cooling plate 36 by cooling the interposer 70 to a temperature below the melting point of the interposer 70. For example, the sample sleeve 14 may be removably attached to the cooling plate 36 by using the interposer 70 between the thermal switch 42 and the cooling plate 36, as illustrated in FIG. 1A. FIG. 1B illustrates using the interposer 70 between the thermal switch 42 and the sample sleeve 14, thereby facilitating removable attachment of the sample sleeve 14 to the thermal switch 42.

In some embodiments, the method 300 further includes an optional step 340 of detaching the sample sleeve 14 from the cooling plate 36 by heating the interposer 70 to a temperature above the melting point of the interposer 70. In the embodiments of using a eutectic gallium indium tin alloy as the interposer 70 material, the interposer 70 may be heated to a temperature above 16° C. for liquefying the interposer 70, thereby detaching the sample sleeve 14. In some embodiments, the interposer 70 is heated to a temperature above melting point of the interposer 70 material for detaching the sample sleeve 14. In an example embodiment, the temperature of the interposer may be maintained at a value that is lower than the 300 K when detaching the sample sleeve 14 from the cooling plate 36. In some embodiments, heating the interposer 70 is accomplished by heating the thermal switch 42.

Example

The following example is presented to further illustrate non-limiting embodiments of the present specification.

Two copper plated Inconel plates were used as top and bottom plates for the experiment. Both the top plate and the bottom plate were brush painted with a eutectic gallium indium tin alloy (alternatively, Galinstan®) having about 66.71 atomic % of gallium, about 20.38 atomic % of indium, and about 12.91 atomic % of tin. Galinstan coated surfaces of the top plate and the bottom plate were contacted with each other making the Galinstan® as an interposer between the top and the bottom plates. Temperature sensors were attached to both the top plate and the bottom plate. Heat was applied to the bottom plate and temperatures of the bottom plate and the top plate were measured at various temperatures.

Figure 4:
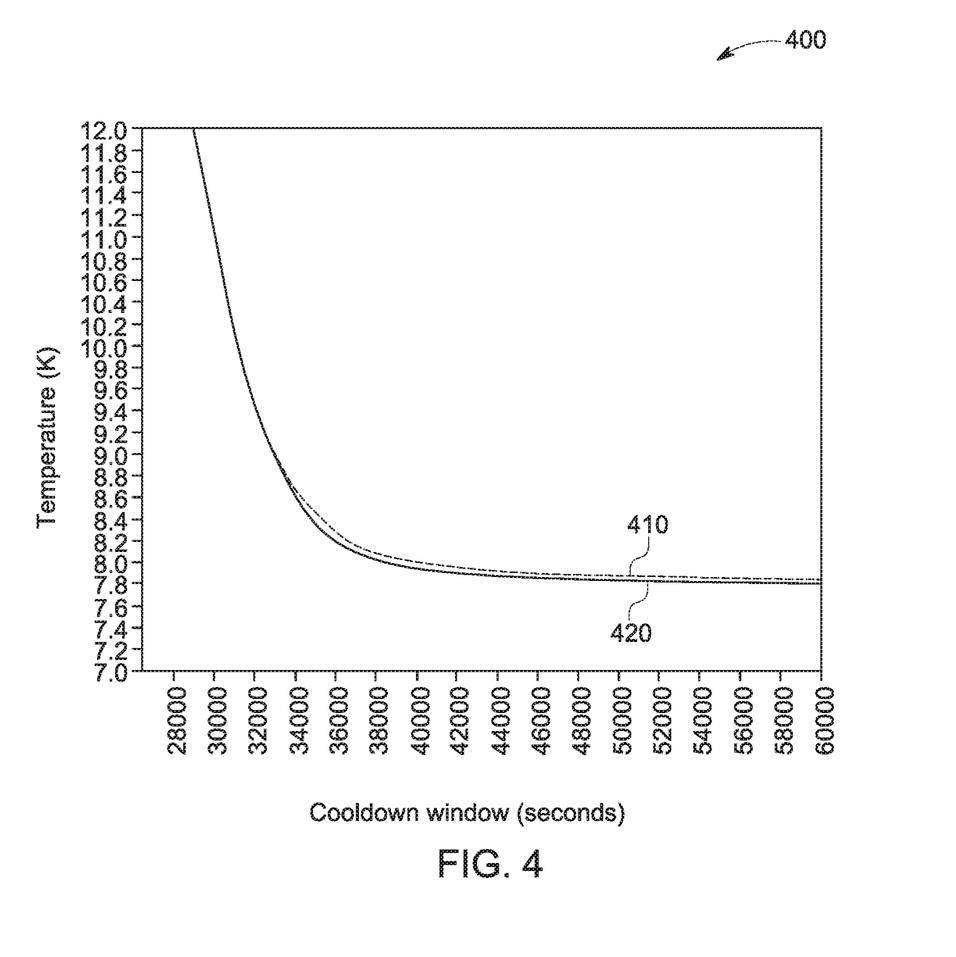
FIG. 4 is a graph illustrating temperature difference between two plates having Galinstan® as an interposer, in accordance with some embodiments of the present specification.

FIG. 4 shows a graphical comparison 400 of cool down curves of the bottom plate (i.e., hot plate) and the top plate (i.e., cold plate). It can be seen from the graph that at any given time, a temperature difference between the cool down curve 410 of the bottom plate and the cool down curve 420 of the top plate is less than 0.1 K. A measured temperature difference between the bottom plate and the top plate at 7.8 K was about 0.03 K which is well below 0.1K.

The heat difference between two plates were measured as described above for various combinations of top and bottom plates and interposer materials, and compared with the temperature difference for the bare plates and the Galinstan® interposer. The results of the experiments were as provided in Table 1 below. In Table 1, combinations of interface materials and interposers are presented in column 1 and 2 with an applied pressure of 330 N onto the sample geometry. Column 3 shows the temperature difference (dT) that remained between the plates after sample cooldown. In some instances, achieving a constant difference in temperature may take a longer period of time. For example, in certain situations, the temperature difference dT may be varying continuously without recording a constant dT for more than half an hour. The reason attributed to this kind of behavior may be the absence of proper contact between the plates. Therefore, if it takes a longer time to record a constant temperature difference dT, the experiment was stopped as the thermal contact may be broken or insufficient. Column 4 shows the temperature at which either the bond failed or a gap between the interfaces opened resulting in a temperature gradient.

TABLE 1

Comparison of the temperature difference between various interface materials and interposers

| Interface Materials | Interposer | dT (K) @ <4 K | Fail T (K) |
|---|---|---|---|
| Copper/copper | Bare/dry | 1.5 | 12 |
| Copper/copper | Galinstan ® | 0 | — |
| Copper/copper | Grease | 0.1 | 7.3 |
| Copper/copper | Indium + grease | 0.055 | — |
| Copper/copper | Al$_2$O$_3$ + grease | 0.145 | 9.5 |
| Copper/copper | Graphite + grease | 2.6 | 15 |
| Copper/copper | Aluminum + grease | 0 | 7 |
| Copper/titanium | Indium + grease | 0.2 | 15 |
| Copper/titanium | Grease | Stopped | 35 |
| Copper/titanium | Galinstan ® | Stopped | 17 |
| Copper/copper plated Inconel ® | Galinstan ® | 1.0 | 16 |
| Copper/copper plated titanium | Galinstan ® | Stopped | 12 |
| Copper plated Inconel ®/ copper plated Inconel ® | Galinstan ® | 0.03 | — |

In Table 1, the "bare" test refers to dry copper/copper contacts in vacuum and was used for benchmarking against all other tests. Although vacuum grease performed well with respect to the final temperature difference, it still failed as a clear gap opened at 7.3 K.

For copper/copper interfaces, indium performed well without showing signs of debonding and with very small final dT of 0.055 K. However, for the titanium/copper interface, the indium bond could not take the shear strength of the dissimilar materials and failed at 15 K, even though the dT recorded was only 0.2 K. High purity indium foil is expensive and difficult to apply on a surface repeatedly as a thin interposer and may need additional grease for better surface contact. The thin indium foil also may not easily compensate for build tolerances during component assembly. Grease (Apiezon® N) and Al$_2$O$_3$ interposers performed well showing only a small dT of 0.1 K and 0.145 K respectively but took a long time to reach an equilibrium state. Also, greased graphite showed the highest temperature difference of 2.6 K that is even higher than the temperature difference with bare, dry contacts.

Aluminum tape and grease showed debonding but gave no measurable temperature difference across the interface. This low dT may be attributed to the high thermal conductivity of aluminum. Aluminum and grease could be used as a low-cost option for some cryogenic applications. Satisfactory results could not be obtained for the copper/titanium material or copper/copper coated titanium combination, confirming that CTE mismatch plays an adverse role on the contact quality. All the dissimilar material interfaces failed and the experiments were stopped before the final temperature difference was obtained. Galinstan® failed as well for dissimilar materials and caused the bond to break. Moreover, Galinstan® as an interposer between copper/copper, copper plated Inconel®/copper plated titanium bonding showed good results. In summary, Galinstan® always gave a perfect bond as long as the material surfaces mated were similar, showing only a very small final temperature difference and without de-bonding during cooldown.

Along with achieving a low temperature difference between two plates, it is also desirable to have a good bonding strength between the contacting plates for achieving repeated use of the material combination during operation. The bond strength between the various interface and interposer combinations listed in Table 1 were measured. It was observed that Galinstan® could repeatedly take the cooldown shear stress with interfaces made of copper/copper, copper sputtered Inconel/copper sputtered Inconel, copper sputtered titanium/copper sputtered titanium, and copper sputtered titanium/copper sputtered Inconel®. Galinstan® seemed to fail due to shear, caused by CTE mismatch, when used as an interposer between dissimilar interfaces.

From the above experiments, Galinstan was fully characterized as an interposer of choice for combinations of similar materials. Galinstan® provided the unique feature of self-locking mating surfaces with good heat transfer capability without the need to apply any pressure on the surfaces and proved to be a reliable and detachable bond. The bond could be thermally cycled from 3 K to room temperature without any failure. This is an advantage over other interposing materials that result in a gap that widens with thermal cycling resulting in a decrease in the heat transfer through the interface. Further, copper plating the surfaces helped to enhance the bond strength between the surfaces avoided surface delamination. Shear strength of Galinstan® was determined and found to be good for use in cooling systems working in cryogenic temperatures.

Various embodiments of a cooling system, an apparatus including the cooling system, and a method of assembling and operating the cooling system are presented in present specification. The cooling system presented herein has easily separable contact surfaces at room temperature and there is no need of applying any external pressure for contact at the operating temperatures of the cooling system. The gallium indium alloy used as the interposer herein is a low-cost material, safe to use, having an easy-to-clean surface aiding in reuse, and has good wettability properties. Further, the gallium indium alloy has outstanding thermal conductivity at temperature 4 K and below and is best suited as the interposer material for the use in a cooling system operating at cryogenic temperatures. The exemplary cooling system may be employed to improve polarization of nuclear spins of samples in NMR systems, such as MRI systems and NMR spectroscopy systems.

This written description uses some examples to disclose the claimed disclosure, including the best mode, to enable any person skilled in the art to practice the disclosure, including making and using any devices or systems and performing any incorporated methods. The scope of the claimed disclosure may include other examples that occur to those skilled in the art. Such other examples are intended to be within the scope of the appended claims if they have structural elements that do not differ from the literal language of the claims, or if they include equivalent structural elements with insubstantial differences from the literal language of the claims.

The invention claimed is:

1. A cooling system, comprising:
a cryogenic chamber comprising a cryogenic fluid;
a cooling plate disposed in the cryogenic chamber, wherein the cooling plate is in contact with the cryogenic fluid such that all but one surface of the cooling plate are in contact with the cryogenic fluid;
a sample sleeve at least partially inserted in the cryogenic chamber, wherein the sample sleeve is configured to receive a sample;
a thermal switch disposed between the cooling plate and the sample sleeve; and
an interposer disposed between at least one of:
i. the thermal switch and the cooling plate and
ii. the thermal switch and the sample sleeve,
wherein the interposer comprises a gallium indium tin alloy.

2. The cooling system of claim 1, wherein the thermal switch comprises a bottom surface comprising copper, wherein the cooling plate comprises a top surface comprising copper, and wherein the interposer is disposed between the bottom surface of the thermal switch and the top surface of the cooling plate.

3. The cooling system of claim 1, wherein the thermal switch comprises a top surface comprising copper, wherein the sample sleeve comprises a bottom surface comprising copper, and wherein the interposer is disposed between the top surface of the thermal switch and the bottom surface of the sample sleeve.

4. The cooling system of claim 1, wherein the cryogenic fluid comprises liquid helium.

5. The cooling system of claim 1, wherein the thermal switch comprises a nickel-chromium super alloy, stainless steel, a titanium alloy, or combinations thereof.

6. The cooling system of claim 1, wherein the cooling plate comprises a nickel-chromium super alloy, stainless steel, a titanium alloy, or combinations thereof.

7. The cooling system of claim 1, wherein the sample sleeve comprises a nickel-chromium super alloy, stainless steel, a titanium alloy, or combinations thereof.

8. The cooling system of claim 1, wherein the interposer comprises gallium in an amount in a range from about 60 atomic % to about 75 atomic %, indium in an amount in a range from about 15 atomic % to about 25 atomic %, and tin in an amount in a range from about 10 atomic % to about 15 atomic %.

9. The cooling system of claim 1, wherein the cooling system is configured to cool the sample for dynamic nuclear polarization to be carried out on the sample while the sample is inside the sample sleeve.

10. The cooling system of claim 9, wherein the cooling system is configured to cool the sample to a temperature less than 2 K.

11. The cooling system of claim 1, wherein the sample sleeve is removably attached to the cooling plate via the thermal switch.

12. A method, comprising:
assembling a cooling system, wherein the assembling comprises:
disposing a cryogenic chamber comprising a cryogenic fluid;
disposing a cooling plate in the cryogenic chamber such that all but one surface of the cooling plate are in contact with the cryogenic fluid;
at least partially inserting a sample sleeve in the cryogenic chamber;
disposing a thermal switch between the cooling plate and the sample sleeve; and
disposing an interposer between at least one of:
(i) the thermal switch and the cooling plate and
(ii) the thermal switch and the sample sleeve,
wherein the interposer comprises a gallium indium tin alloy.

13. The method of claim 12, wherein the assembling further comprises sputtering copper on a bottom surface of the thermal switch and on a top surface of the cooling plate, prior to disposing the interposer between the thermal switch and the cooling plate.

14. The method of claim 12, wherein the assembling further comprises sputtering copper on a top surface of the thermal switch and on a bottom surface of the sample sleeve, prior to disposing the interposer between the thermal switch and the sample sleeve.

15. The method of claim 12, further comprising removably attaching the sample sleeve to the cooling plate by cooling the interposer to a temperature below the melting point of the interposer.

16. The method of claim 15, further comprising detaching the sample sleeve from the cooling plate by heating the interposer to a temperature above the melting point of the interposer.

17. The method of claim 16, wherein heating the interposer comprises heating the thermal switch.

18. The cooling system of claim 1, wherein the thermal switch is configured to allow the thermal energy to pass through body of the thermal switch in "ON" state and is further configured to not allowing thermal energy to pass through the body of the thermal switch in "OFF" state.

19. The cooling system of claim 1, wherein the cooling plate is used to remove heat from the thermal switch.

20. The cooling system of claim 1, wherein the cryogenic chamber further comprises a sample pot within which the sample sleeve is located, the sample pot forms an enclosed volume within the cryogenic chamber.

21. The cooling system of claim 20, wherein a lower portion of the sample sleeve includes a separate cryogenic fluid separated from the cryogenic fluid that is present in the cryogenic chamber which is outside of the sample pot.

* * * * *